(12) United States Patent
Ren et al.

(10) Patent No.: US 11,898,224 B2
(45) Date of Patent: Feb. 13, 2024

(54) HIGH THERMAL CONDUCTIVITY ALUMINUM ALLOY AND PREPARATION METHOD THEREOF

(71) Applicant: ZHUHAI RUNXINGTAI ELECTRICAL CO., LTD, Guangdong (CN)

(72) Inventors: Huaide Ren, Guangdong (CN); Jicheng Wang, Guangdong (CN); Gunan Li, Guangdong (CN); Jie Tan, Guangdong (CN); Ying Zhang, Guangdong (CN); Mingfeng Wang, Guangdong (CN)

(73) Assignee: ZHUHAI RUNXINGTAI ELECTRICAL CO., LTD, Zhuhai (CN)

(*) Notice: Subject to any disclaimer, the term of this patent is extended or adjusted under 35 U.S.C. 154(b) by 882 days.

(21) Appl. No.: 16/962,224

(22) PCT Filed: Aug. 14, 2019

(86) PCT No.: PCT/CN2019/100502
§ 371 (c)(1),
(2) Date: Jul. 15, 2020

(87) PCT Pub. No.: WO2020/020382
PCT Pub. Date: Jan. 30, 2020

(65) Prior Publication Data
US 2021/0062304 A1  Mar. 4, 2021

(30) Foreign Application Priority Data
Dec. 14, 2018 (CN) .......................... 201811532160.5

(51) Int. Cl.
C22C 21/02  (2006.01)
B22D 17/00  (2006.01)
C22C 1/06  (2006.01)
C22C 1/10  (2023.01)
C22C 1/12  (2023.01)

(52) U.S. Cl.
CPC ............ *C22C 21/02* (2013.01); *B22D 17/007* (2013.01); *C22C 1/06* (2013.01); *C22C 1/1036* (2013.01); *C22C 1/12* (2023.01); *C22C 1/1073* (2023.01)

(58) Field of Classification Search
CPC ...................................................... C22C 21/02
See application file for complete search history.

(56) References Cited

U.S. PATENT DOCUMENTS

| | | | |
|---|---|---|---|
| 2001/0043880 A1* | 11/2001 | Hwang | C22C 21/02 420/532 |
| 2011/0000336 A1* | 1/2011 | Imanishi | C22C 49/14 75/243 |
| 2013/0105045 A1* | 5/2013 | Yan | C22F 1/043 148/95 |
| 2013/0237404 A1* | 9/2013 | Lee | B82Y 30/00 501/153 |
| 2017/0107599 A1* | 4/2017 | Wang | C22C 21/02 |
| 2020/0131605 A1* | 4/2020 | Alexander | F04B 1/0408 |

FOREIGN PATENT DOCUMENTS

| | | |
|---|---|---|
| CN | 105296818 A | 2/2016 |
| CN | 108286001 A | 7/2018 |
| CN | 108531769 A | 9/2018 |

OTHER PUBLICATIONS

International Search Report of PCT Patent Application No. PCT/CN2019/100502 dated Nov. 8, 2019.

* cited by examiner

*Primary Examiner* — Christopher S Kessler

(57) ABSTRACT

The present invention provides a high thermal conductivity aluminum alloy, which comprises the following components in percentage by weight: Al: 80%-90%; Si: 6.5%-8.5%; Fe: 0.2%-0.5%; Zn: 0.8%-3%; V: 0.03%-0.05%; Sr: 0.01%-1%; graphene: 0.02%-0.08%. In the high thermal conductivity aluminum alloy of the present invention, alloying elements including Si, Fe, and Zn are optimized; Sr, V, graphene, among others are added. The amount of each component is controlled so that they coordinate to ALLOW high thermal conductivity, good casting performance and excellent semi-solid die-casting property. Graphene is introduced to the high thermal conductivity aluminum alloy of the present invention to exploit the good thermal conductivity of graphene, allowing the formation of a high thermal conductivity aluminium alloy.

7 Claims, No Drawings

HIGH THERMAL CONDUCTIVITY ALUMINUM ALLOY AND PREPARATION METHOD THEREOF

CROSS-REFERENCE TO PRIOR APPLICATION

This application claims the benefit of Chinese patent application No. 201811532160.5, filed to the CNIPA on Dec. 14, 2018, titled "high thermal conductivity aluminium alloy and preparation method thereof", which is incorporated by reference in its entirety.

FIELD OF THE INVENTION

The embodiments of the present invention relate to the field of metal materials, and particularly to an aluminum alloy.

BACKGROUND OF THE INVENTION

With the rapid development of modern electronic and information technology and manufacturing technology, electronic systems and 5G communication devices are developing towards achieving large-scale integration, miniaturization, lightweight, and high power. This undoubtedly leads to challenges in the efficient heat dissipation of electronic systems and 5G communication devices. According to research data, around half of electronic device failure can be attributed to overheating and heat-related problems. The research data also shows that for a semiconductor component, every 10° C. increase in its temperature undermines its reliability by 50%. When a component is working under very high temperatures, its failure rate increases exponentially with increasing temperature.

Aluminum alloys have a range of desirable properties. They have low density, high strength, good electrical and thermal conductivity, and are easy to process. They are able to meet various requirements in product structure and heat dissipation and are therefore widely used in the fields of automobiles, electronics, and communication. Pure aluminum has a relatively high thermal conductivity of around 238 W/(m·K) at room temperature. The thermal conductivity of wrought aluminum alloys, such as 6063, also reaches 209 W/(m·K). However, with the increase of elements in the aluminium alloy, the thermal conductivity of the alloy gradually decreases. The influence of different elements on the thermal conductivities of alloys varies significantly. This variation is mainly determined by the free electron conduction mechanism of metals. The electrical conductivity of an aluminum alloy is related to the degree of lattice distortion, defects, impurities, phase composition and distribution in its structure.

Therefore, it is a pressing need in the field of electronic communication devices to provide a high thermal conductivity aluminum alloy with prolonged service life and reduced damage caused by overheating. This has an important industrial application in improving the performance of electronic communication devices.

SUMMARY OF THE INVENTION

The objective of the present invention is to provide a high thermal conductivity aluminium alloy having high electrical conductivity, optimized casting performance and semi-solid die-casting performance, and a preparation method thereof.

According to one aspect of the present invention, a high thermal conductivity aluminum alloy is provided, the high thermal conductivity aluminum alloy comprises the following components in percentage by weight:
Al: 80%-90%;
Si: 6.5%-8.5%;
Fe: 0.2%-0.5%;
Zn: 0.8%-3%;
V: 0.03%-0.05%;
Sr: 0.01%-1%;
graphene: 0.02%-0.08%.

Optionally, the high thermal conductivity aluminum alloy comprises the following components in percentage by weight:
Al: 82%-90%;
Si: 6.8%-7.8%;
Fe: 0.25%-0.45%;
Zn: 1%-2.5%;
V: 0.035%-0.045%;
Sr: 0.015%-0.8%;
graphene: 0.04%-0.07%.

Optionally, the high thermal conductivity aluminum alloy comprises the following components in percentage by weight:
Al: 85%-88%;
Si: 7%-7.5%;
Fe: 0.3%-0.4%;
Zn: 1.5%-2%;
V: 0.038%-0.042%;
Sr: 0.02%-0.6%;
graphene: 0.05%-0.06%.

Optionally, the high thermal conductivity aluminum alloy comprises the following components in percentage by weight:
Al: 80%-82%;
Si: 6.5%-8.5%;
Fe: 0.2%-0.5%;
Zn: 0.8%-3%;
V: 0.03%-0.05%;
Sr: 0.01%-1%;
graphene: 0.02%-0.08%;
RE: 1-5%.

Optionally, said RE comprises one or more components selected from the group consisting of La, Ce, Pr, Nd, Pm, Sm, Eu, Gd, Tb, Dy, Ho, Er, Tm, Yb, Lu, Y, and Sc.

Optionally, said RE contains one or more of the following components in percentage by weight of RE:
La: 40%-70%;
Sc: ≤15%;
Y: ≤15%.

Optionally, the high thermal conductivity aluminum alloy comprises the following components in percentage by weight:
Al: 80%-82%;
Si: 6.5%-8.5%;
Fe: 0.2%-0.5%;
Zn: 0.8%-3%;
V: 0.03%-0.05%;
Sr: 0.01%-1%;
graphene: 0.02%-0.08%;
La: 0.4%-3.5%;
Sc: ≤0.75%;
Y: ≤0.75%.

According to another aspect of the invention, a method for preparing a high thermal conductivity aluminum alloy is provided, which comprises the following:

(1) weighing Al, Si, Fe, Zn, V, Sr and graphene according to their designated weight percentages; heating these components together at a melting temperature set to 700-750° C. until molten to obtain an aluminum alloy liquid;

(2) introducing the aluminum alloy liquid into a spraying device; performing powder injection refining using an inert gas as a carrier for an injection refining time set to 8-18 minutes; after refining, the aluminum alloy liquid is left to stand for 15 to 30 minutes, followed by filtering;

(3) transferring the aluminum alloy liquid after the filtering in step (2) to a rotor degassing device; performing secondary degassing by blowing nitrogen gas into the aluminum alloy liquid during rotation, wherein the rotor degassing device has a rotational speed set to 500 to 600 rpm, a gas flow rate of 10-20 liters/min;

(4) mechanically stirring a degassed aluminum alloy liquid obtained in step (3) until reaching a semi-solid state and a temperature of 580-610° C. to obtain an aluminum alloy semi-solid slurry;

(5) performing die-casting molding with the aluminum alloy semi-solid slurry obtained in step (4) at a temperature 575-590° C., an injection speed of 1.5-2.5 m/s, an injection specific pressure set to 30-50 MPa, and a boost pressure set to 60-80 MPa; holding pressure for 7 s to 15 s after completion of injection to obtain the high thermal conductivity aluminum alloy.

Optionally, the method for preparing the high thermal conductivity aluminum alloy further comprises step (6): performing aging treatment at 300-500° C. for 1-2 hours after the die-casting molding of the aluminum alloy semi-solid slurry in step (5); cooling to obtain the high thermal conductivity aluminum alloy.

Optionally, step (1) of the method for preparing the high thermal conductivity aluminum alloy further comprises weighing RE according to a designated weight percentage; heating the RE together with Al, Si, Fe, Zn, V, Sr, and graphene until molten to obtain the aluminum alloy liquid.

The main alloy elements of the high thermal conductivity aluminum alloy of the present invention are Si, Fe, Zn, V, Sr, graphene, and RE. In the present invention, the main alloying elements of Si, Fe, and Zn are optimized; on this basis, vanadium is added to refine and modify the Fe-rich phase; Sr and RE elements are added to refine and modify eutectic silicon; graphene is added to increase thermal conductivity. Additionally, the amounts of alloying elements and impurities are strictly controlled so that they coordinate to ensure the aluminum alloy has optimal performance. As a result, the alloy is a high thermal conductivity aluminium alloy that is highly thermally conductive and has good casting performance and excellent mechanical properties.

The role and amount of each component in the high thermal conductivity aluminum alloy are described below.

Al is a major component in forming an aluminum alloy. In the high thermal conductivity aluminum alloy of the present invention, the weight percentage of Al is within the range of 80% to 90%.

Si is one of the important components in forming an aluminum alloy. The lattice constant of Si differs greatly from that of Al. Silicon dissolved in an aluminum matrix will lead to lattice distortion of the aluminum matrix. Under the effect of an external electric field, the resistance for electron wave propagation increases, resistance increases, the thermal conductivity of the aluminum alloy decreases. On the other hand, silicon could form an Al+Si eutectic liquid phase with Al in the aluminum alloy, which simultaneously increases the die-casting fluidity, the strength, and the mechanical and processing performance of the aluminum alloy. The presence of a larger amount of Si results in a larger eutectic liquid phase and better die-casting fluidity of the aluminum alloy; however, both the thermal conductivity and plasticity of the die-casting aluminum alloy decrease. When the amount of Si is less than 6.5%, the fluidity of the aluminum alloy is such that the process requirements of semi-solid die-casting cannot be satisfied. When the amount of Si exceeds 8.5%, the thermal conductivity of the aluminum alloy is greatly affected. To ensure that the aluminium alloy has high thermal conductivity and good semi-solid die-casting molding properties, the amount of silicon is within the range of 6.5% to 8.5%, preferably 6.8% to 8%, and more preferably 7.0% to 8%.

Fe is an inevitable impurity present in the aluminum alloy. Fe forms a coarse β-AlFeSiFe phase in the aluminum alloy. This β-AlFeSiFe phase severely splits the aluminum alloy matrix, resulting in low strength and low plasticity of the aluminium alloy. The high thermal conductivity aluminum alloy of the present invention limits the amount of Fe impurity to be within the range of 0.2% to 0.5%, preferably 0.25% to 0.45%, and more preferably 0.3% to 0.4%.

As one of the important components of the high thermal conductivity aluminum alloy of the present invention, V mainly acts to refine and modify the β-AlFeSiFe phase. In the high thermal conductivity aluminum alloy of the present invention, the growing direction of Fe in the Fe-rich phase of the aluminum alloy is changed and suppressed by adding V; as a result, the β-AlFeSiFe phase changes from a coarse needle shape to uniform, fine particles. This eliminates the impact of the Fe-rich phase on the strength and plasticity of the aluminum alloy; consequently, the aluminum alloy has high strength and high plasticity. The amount of V in the high thermal conductivity aluminum alloy of the present invention is 0.03% to 0.05%, the preferred amount of V is 0.035% to 0.045%, the more preferred amount of V is 0.038% to 0.042%, and the most preferred amount of V is 4%.

Sr is one of the important components of the high thermal conductivity aluminum alloy of the present invention. Sr is added to the high thermal conductivity aluminum alloy of the present invention. In the semi-solid die-casting aluminum alloy, Sr acts to modify the eutectic silicon in the Al—Si alloy. Unmodified eutectic silicon in Al—Si alloy is mainly fibrous, long needle-shaped and unevenly distributed. In Al alloys, eutectic silicon usually has an elongated needle shape, such eutectic silicon will split the aluminum alloy matrix, which is an important cause for the low strength and low plasticity of traditional die-cast aluminum alloys. In the prior art, the refinement and modification of eutectic silicon are mainly carried out by adding Na, but the use of Na in modification has several drawbacks including short effective time and environmental pollution. The addition of Sr to the high thermal conductivity aluminum alloy of the present invention refines and modifies the eutectic silicon in the aluminum alloy, allowing it to change from fibrous, long needles to uniformly distributed short rods and spheres. This significantly improves the mechanical properties of the high thermal conductivity aluminum alloy of the present invention. Its technical effect is significantly better than that of the traditional Na modifier, and has the advantages of good stability, long effective time, and good reproducibility. The amount of Sr in the high thermal conductivity aluminum alloy of the present invention is 0.01% to 1%, the preferred amount of Sr is 0.015% to 0.8%, and the more preferred amount of Sr is 0.02% to 0.6%.

Graphene is one of the important components of the high thermal conductivity aluminum alloy of the present invention and has very good thermal conductivity. The thermal conductivity of pure, defect-free single-layer graphene is as high as 5300 W/mK; it is the carbon material with the highest thermal conductivity to this date, higher than single-walled carbon nanotubes (3500 W/mK) and multi-walled carbon nanotubes (3000 W/mK). When it is used as a carrier, its thermal conductivity can reach 600 W/mK. Graphene is added to the high thermal conductivity aluminum alloy of the present invention to improve thermal conductivity. As graphene is expensive, the amount of graphene added in the present invention is within the range of 0.02%-0.08%, the preferred amount of graphene is 0.04%-0.07%, the more preferred amount of graphene is 0.05%-0.06%.

RE (rare earth element) is one of the important components of the high thermal conductivity aluminum alloy of the present invention. It has excellent degassing, impurity removal, and modification abilities, and can increase the thermal conductivity of the alloy. This is because after metal Al is molten, it absorbs hydrogen more easily with increasing temperature; RE has good hydrogen fixation abilities through the generation of stable rare earth hydrides (REH2, REH3) with hydrogen. In addition, RE forms stable intermetallic compounds (FeRE5, etc.) and AlRESi distributed in the grain boundary respectively with harmful impurities and silicon dissolved in the liquid aluminum alloy. This reduces the porosity of the aluminum alloy and the amounts of impurities and silicon dissolved in aluminum, thereby reducing impurities inside the grains, reducing lattice distortion, and increasing the thermal conductivity of the alloy.

DETAILED DESCRIPTION OF THE ILLUSTRATED EMBODIMENTS

To clarify the objectives, technical solutions, and beneficial effects of the embodiments of the present invention, the technical solutions of the present invention will be clearly and fully described with reference to the embodiments of the present invention. The described embodiments are only a part of the embodiments of the present invention and do not cover all possible embodiments. Based on the embodiments in the present invention, all other embodiments obtained by a person of ordinary skill in the art without creative efforts fall within the protection scope of the present invention. It should be noted that without introducing any contradiction, the embodiments in the present application and the features in the embodiments can be arbitrarily combined.

The high thermal conductivity aluminium alloy provided in the present application will be explained in detail below with reference to specific embodiments.

Embodiment 1

A high thermal conductivity aluminium alloy that comprises the following components in percentage by weight:
Al: 90%;
Si: 6.5%;
Fe: 0.2%;
Zn: 0.8%;
V: 0.03%;
Sr: 0.01%;
graphene: 0.02%.

The thermal conduction coefficient of the high thermal conductivity aluminium alloy of embodiment 1 reaches a maximum of 198. It shows the best thermal conductivity.

Embodiment 2

A high thermal conductivity aluminium alloy that comprises the following components in percentage by weight:
Al: 80%;
Si: 8.5%;
Fe: 00.5%;
Zn: 3%;
V: 0.05%;
Sr: 1%;
graphene: 0.08%.

Comparing the molded high thermal conductivity aluminium alloy of embodiment 2 to high thermal conductivity aluminium alloys of other compositions, the high thermal conductivity aluminium alloy of embodiment 2 is lighter per unit volume.

Embodiment 3

A high thermal conductivity aluminium alloy that comprises the following components in percentage by weight:
Al: 90%;
Si: 6.8%;
Fe: 0.25%;
Zn: 1%;
V: 0.035%;
Sr: 0.015%;
graphene: 0.04%.

The molding rate of the high thermal conductivity aluminium alloy of embodiment 3 reaches 96.02%. Process steps are reduced, time and cost are saved.

The parameters of the high thermal conductivity aluminium alloys from the various embodiments of the present invention are present in the table below. It should be noted that the total amount of the components in an embodiment is slightly less than 100%; this can be understood as due to the presence of a trace amount of impurities.

Table 1 shows the thermal conductivity of some embodiments of the present invention.

TABLE 1

| No. | Chemical composition (mass fraction/%) | | | | | | | Thermal Conductivity (W/mK) |
| --- | --- | --- | --- | --- | --- | --- | --- | --- |
| | Si | Fe | Zn | V | Sr | Graphene | Al | |
| A4 | 6.5 | 0.2 | 0.8 | 0.03 | 0.01 | 0.02 | Remaining amount | 195 |
| A5 | 6.9 | 0.27 | 1.5 | 0.033 | 0.24 | 0.031 | Remaining amount | 184 |

TABLE 1-continued

| | Chemical composition (mass fraction/%) | | | | | | | Thermal Conductivity |
|---|---|---|---|---|---|---|---|---|
| No. | Si | Fe | Zn | V | Sr | Graphene | Al | (W/mK) |
| A6 | 7.4 | 0 | 2 | 0.04 | 0.52 | 0.042 | Remaining amount | 185 |
| A7 | 8 | 0.45 | 2.4 | 0.046 | 0.71 | 0.057 | Remaining amount | 189 |
| A8 | 8.5 | 0.5 | 3 | 0.05 | 1 | 0.08 | Remaining amount | 187 |

Table 2 shows performance parameters of some embodiments of the present invention.

TABLE 2

| | Sample name | A9 | A10 | A11 | A12 | A13 | A14 |
|---|---|---|---|---|---|---|---|
| Components | Al | 88% | 85% | 82% | 80% | 82% | 80% |
| | Si | 7% | 7.5% | 6.5% | 8.5% | 6.5% | 8.5% |
| | Fe | 0.3% | 0.4% | 0.2% | 0.5% | 0.2% | 0.5% |
| | Zn | 1.5% | 2% | 0.8% | 3% | 0.8% | 3% |
| | V | 0.038% | 0.042% | 0.03% | 0.05% | 0.03% | 0.05% |
| | Sr | 0.03% | 0.6% | 0.01% | 1% | 0.01% | 1% |
| | Graphene | 0.05% | 0.06% | 0.02% | 0.08% | 0.02% | 0.08% |
| | RE | — | — | 1% La10% Ce10% Pr10% Nd10% Pm10% Sm10% Eu10% Gd10% Tb10% Dy10% | 5% La10% Ce10% Pr10% Nd10% Pm10% Sm10% Eu10% Gd10% Tb10% Dy10% | 1% La40% Sc15% Y15% Ho15% Er15% | 5% La70% Sc5% Y5% Ho10% Er10% |
| Parameters | Density g/cm3 | 2.64 | 2.67 | 2.65 | 2.61 | 2.63 | 2.59 |
| | Specific heat capacity J/(g*° C.) | 0.878 | 0.874 | 0.916 | 0.902 | 0.885 | 0.917 |
| | Thermal Conductivity W/(m/K) | 182 | 185 | 195 | 187 | 184 | 189 |
| | Thermal conduction coefficient mm2/s | 78.53 | 79.28 | 80.35 | 79.39 | 79.05 | 79.62 |
| | Porosity % | 1.3 | 1.1 | 0.9 | 1.0 | 1.2 | 0.8 |
| | molding rate % | 95.3 | 93.2 | 92.8 | 94.1 | 93.7 | 94.6 |

In Table 2, the amount of RE is presented in two columns. The first column is the amount of RE as a percentage of the total weight percentage of the high thermal conductivity aluminium alloy of the present invention. The second column is the amount of each rare-earth element as a percentage of the total weight percentage of RE.

The disclosure above can be implemented individually or in various combinations, and these variations are within the protection scope of the present invention.

Finally, it should be noted that the terms "include", "comprise", or any other variant thereof herein are intended to cover a non-exclusive inclusion, so that a process, a method, an article, or a device that includes or comprises a series of elements includes not only those elements, but also other elements that are not explicitly listed, or include elements inherent to this process, method, article, or device. Without more restrictions, the element defined by the phrase "include a/an/one . . . " does not exclude the possibility of having an additional identical element in the process, method, article, or device comprising the element.

The embodiments above are only used to illustrate the technical solutions of the present invention, but not to limit them. Although the present invention has been described in detail with reference to the above embodiments, a person of ordinary skill in the art should understand that they can still modify the technical solutions described in the embodiments above or equivalently replace some of the technical features therein; these modifications or replacements do not deviate the essence of the corresponding technical solutions from the spirit and scope of the technical solutions of the embodiments of the present invention.

INDUSTRIAL APPLICABILITY

1. The high thermal conductivity aluminium alloy of the present invention optimizes Si, Fe, Zn and other alloying elements, adds Sr, V, graphene, and RE elements. The amount of each component is controlled so that they coordinate to allow high thermal conductivity, good casting performance, and excellent semi-solid die-casting performance.

2. Graphene is added to the high thermal conductivity aluminium alloy of the present invention. This exploits the good thermal conductivity of graphene and allows the formation of a high thermal conductivity aluminium alloy.

3. The high thermal conductivity aluminum alloy of the present invention lowers the amounts of silicon and other impurities dissolved in the aluminum alloy and reduces internal defects such as dispersed shrinkage and shrinkage holes, thereby reducing impurities inside crystal grains, reducing lattice distortion, and increasing the thermal conductivity of the aluminum alloy.

4. The high thermal conductivity aluminum alloy of the present invention has high electrical conductivity, which meets the latest development needs in the field of electronics communications; it can also meet the requirements placed by the rapid development in the field of communications on the performance of semiconductor components.

What is claimed is:

1. A high thermal conductivity aluminum alloy, characterized in that the high thermal conductivity aluminum alloy comprises the following components in percentage by weight:
Al: 80%-90%;
Si: 6.5%-8.5%;
Fe: 0.2%-0.5%;
Zn: 0.8%-3%;
V: 0.03%-0.05%;
Sr: 0.01%-1%;
graphene: 0.02%-0.08%.

2. The high thermal conductivity aluminum alloy according to claim 1, characterized in that the high thermal conductivity aluminum alloy comprises the following components in percentage by weight:
Al: 82%-90%;
Si: 6.8%-7.8%;
Fe: 0.25%-0.45%;
Zn: 1%-2.5%;
V: 0.035%-0.045%;
Sr: 0.015%-0.8%;
graphene: 0.04%-0.07%.

3. The high thermal conductivity aluminum alloy according to claim 2, characterized in that the high thermal conductivity aluminum alloy comprises the following components in percentage by weight:
Al: 85%-88%;
Si: 7%-7.5%;
Fe: 0.3%-0.4%;
Zn: 1.5%-2%;
V: 0.038%-0.042%;
Sr: 0.02%-0.6%;
graphene: 0.05%-0.06%.

4. The high thermal conductivity aluminum alloy according to claim 1, characterized in that the high thermal conductivity aluminum alloy comprises the following components in percentage by weight:
Al: 80%-82%;
Si: 6.5%-8.5%;
Fe: 0.2%-0.5%;
Zn: 0.8%-3%;
V: 0.03%-0.05%;
Sr: 0.01%-1%;
graphene: 0.02%-0.08%;
RE: 1-5%.

5. The high thermal conductivity aluminum alloy according to claim 4, characterized in that said RE comprises one or more components selected from the group consisting of La, Ce, Pr, Nd, Pm, Sm, Eu, Gd, Tb, Dy, Ho, Er, Tm, Yb, Lu, Y, and Sc.

6. The high thermal conductivity aluminum alloy according to claim 5, characterized in that said RE comprises one or more of the following components in percentage by weight of RE:
La: 40%-70%;
Sc: ≤15%;
Y: ≤15%.

7. The high thermal conductivity aluminum alloy according to claim 1, characterized in that the high thermal conductivity aluminum alloy comprises the following components in percentage by weight:
Al: 80%-82%;
Si: 6.5%-8.5%;
Fe: 0.2%-0.5%;
Zn: 0.8%-3%;
V: 0.03%-0.05%;
Sr: 0.01%-1%;
graphene: 0.02%-0.08%;
La: 0.4%-3.5%;
Sc: ≤0.75%;
Y: ≤0.75%.

* * * * *